United States Patent
Ono et al.

(10) Patent No.: US 12,341,367 B2
(45) Date of Patent: Jun. 24, 2025

(54) CHARGING CONTROLLER AND VEHICLE

(71) Applicant: TOYOTA JIDOSHA KABUSHIKI KAISHA, Toyota (JP)

(72) Inventors: Tomoya Ono, Toyota (JP); Toru Ando, Obu (JP); Yamato Niwa, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 722 days.

(21) Appl. No.: 17/736,718

(22) Filed: May 4, 2022

(65) Prior Publication Data

US 2022/0368140 A1  Nov. 17, 2022

(30) Foreign Application Priority Data

May 11, 2021 (JP) .................................. 2021-080477

(51) Int. Cl.

| | |
|---|---|
| H02J 7/00 | (2006.01) |
| B60L 53/16 | (2019.01) |
| B60L 53/18 | (2019.01) |
| B60L 53/60 | (2019.01) |
| G01R 31/12 | (2020.01) |

(Continued)

(52) U.S. Cl.
CPC ............ H02J 7/0029 (2013.01); B60L 53/16 (2019.02); B60L 53/18 (2019.02); B60L 53/60 (2019.02); G01R 31/1245 (2013.01); G01R 31/3835 (2019.01); G01R 31/52 (2020.01);
(Continued)

(58) Field of Classification Search
None
See application file for complete search history.

(56) References Cited

U.S. PATENT DOCUMENTS

| 2010/0244850 A1* | 9/2010 | Yano ....................... B60L 58/40 |
| | | 324/510 |
| 2012/0140371 A1* | 6/2012 | Gaul ........................ B60L 3/04 |
| | | 361/93.6 |

(Continued)

FOREIGN PATENT DOCUMENTS

| JP | 2020-068573 A | 4/2020 |
| JP | 2020-124033 A | 8/2020 |

OTHER PUBLICATIONS

IEC, "IEC 62909-2 ED1:Bi-directional grid connected power converters—Part2: Interface of GCPC and distributed energy resources and additional requirements to Part1", 22E/193/CDF, Feb. 9, 2018, pp. 1-22 (22 pages total).

*Primary Examiner* — Julian D Huffman
*Assistant Examiner* — Sadia Kousar
(74) *Attorney, Agent, or Firm* — Sughrue Mion, PLLC

(57) ABSTRACT

A charging controller carries out charging control of a power storage mounted on a vehicle. The vehicle includes a DC charging inlet. The charging controller carries out first charging control when a charging cable which is not a prescribed charging cable is connected to the DC charging inlet and carries out second charging control when the prescribed charging cable is connected to the DC charging inlet. For example, a time period for ground fault detection carried out during charging of the power storage is set differently between first charging control and second charging control. Alternatively, a response delay margin of a charging command is set differently between first charging control and second charging control.

9 Claims, 10 Drawing Sheets

(51) Int. Cl.
*G01R 31/3835* (2019.01)
*G01R 31/52* (2020.01)
*H02J 7/02* (2016.01)

(52) U.S. Cl.
CPC ............ *H02J 7/00045* (2020.01); *H02J 7/02* (2013.01); *H02J 2207/20* (2020.01)

(56) References Cited

U.S. PATENT DOCUMENTS

| | | |
|---|---|---|
| 2013/0120883 A1 | 5/2013 | Yuno et al. |
| 2020/0122597 A1 | 4/2020 | Ichikawa |

\* cited by examiner

CHARGING CONTROLLER AND VEHICLE

This nonprovisional application is based on Japanese Patent Application No. 2021-080477 filed with the Japan Patent Office on May 11, 2021, the entire contents of which are hereby incorporated by reference.

BACKGROUND

Field

The present disclosure relates to a charging controller and a vehicle.

Description of the Background Art

General direct-current (DC) charging (charging with DC power) is carried out as quick charging. Recently, however, normal charging with DC power has been proposed. For example, Japanese Patent Laying-Open No. 2020-068573 discloses a technique for a vehicle to carry out both of DC quick charging (quick charging with DC power) and DC normal charging (normal charging with DC power). A controller configured to switch between a DC quick charging mode and a DC normal charging mode is mounted on a vehicle described in Japanese Patent Laying-Open No. 2020-068573.

SUMMARY

Various charging schemes have recently been proposed. In addition, various power feed facilities have also been proposed for adapting to such various charging schemes. Therefore, a vehicle is also required to adapt to a plurality of types of power feed facilities different in power feed characteristics.

In order for a vehicle to be able to charge a vehicle-mounted battery with the use of a plurality of types of power feed facilities, a large margin (what is called a safety margin) in charging control may be set so as to not to cause a malfunction during charging even when the battery is charged with the use of any of standard power feed facilities in the marketplace. A large margin in control, however, tends to lead to delay in processing or lowering in convenience of a user.

The present disclosure was made to solve the problems above, and an object thereof is to estimate characteristics of a power feed facility to be used for charging of a power storage mounted on a vehicle and to carry out control in accordance with power feed characteristics during charging of the power storage.

A charging controller according to a first point of view of the present disclosure is configured to carry out charging control of a power storage mounted on a vehicle. The vehicle includes a DC charging inlet, a first ground fault detection circuit, and a second ground fault detection circuit shorter in detection time period than the first ground fault detection circuit. The charging controller is configured to carry out first charging control when a charging cable which is not a prescribed charging cable is connected to the DC charging inlet and to carry out second charging control when the prescribed charging cable is connected to the DC charging inlet. Each of the first charging control and the second charging control is control for charging the power storage with DC power supplied from the outside of the vehicle to the DC charging inlet. In the first charging control, ground fault detection is carried out by using the first ground fault detection circuit during charging of the power storage. In the second charging control, ground fault detection is carried out by using the second ground fault detection circuit during charging of the power storage. The DC charging inlet is also referred to as a "DC inlet" below.

When a floating capacitance of the power feed facility used for charging is high, accuracy in ground fault detection may be lowered due to influence by the floating capacitance unless ground fault detection is carried out after charging by the floating capacitance (capacitor component). Then, the charging controller determines, based on a charging cable connected to the DC inlet of the vehicle, whether or not a power feed facility using the charging cable is adapted to the second ground fault detection circuit. With the charging controller, the charging cable employed in the power feed facility adapted to the second ground fault detection circuit can be set in advance as the prescribed charging cable. Then, when a charging cable connected to the DC inlet is not the prescribed charging cable, the charging controller estimates that the floating capacitance of the power feed facility is high and carries out ground fault detection with the use of the first ground fault detection circuit during charging of the power storage. By using the first ground fault detection circuit long in detection time period, charging by the floating capacitance (capacitor component) is more readily carried out and ground fault is more readily accurately detected. When the charging cable connected to the DC inlet is the prescribed charging cable, the charging controller estimates that the floating capacitance of the power feed facility is low, and carries out ground fault detection with the use of the second ground fault detection circuit during charging of the power storage. By using the second ground fault detection circuit short in detection time period, ground fault detection can be carried out in a short period of time.

With the control described above, the charging controller can carry out ground fault detection during charging of the power storage in a manner in accordance with the power feed characteristics.

The second ground fault detection circuit may be a ground fault detection circuit for travel used in ground fault detection during travel of the vehicle. The prescribed charging cable may be a charging cable employed in a power feed facility adapted to the ground fault detection circuit for travel.

Ground fault detection during charging may be entrusted to a power feed facility side, rather than a vehicle side. The power feed facility, however, does not necessarily perform a ground fault detection function. According to the configuration, the vehicle side can carry out not only ground fault detection during travel but also ground fault detection during charging.

The prescribed charging cable may include a charging cable including an AC/DC conversion circuit that converts alternating-current (AC) power into DC power.

The charging cable is able to convert AC power into DC power. By using such a charging cable, a vehicle including only the DC inlet (that is, a vehicle not including an AC charging inlet) is also able to charge the power storage with an AC power supply (for example, a household power supply).

The charging controller may further include a storage that stores specifications indicating a power feed specification associated with the prescribed charging cable and a standard specification of a DC power feed facility. The first charging control may be charging control adapted to the standard specification of the DC power feed facility. The second charging control may be charging control adapted to the power feed specification associated with the prescribed charging cable.

When the charging cable connected to the DC inlet is not the prescribed charging cable, the charging controller estimates that the power feed specification (power feed characteristic) is unknown and carries out charging control adapted to the standard specification of the DC power feed facility. By doing so, a malfunction is less likely during charging of the power storage. When the charging cable connected to the DC inlet is the prescribed charging cable, the charging controller estimates that the power feed specification has already been known (registered) and carries out charging control adapted to a prescribed power feed specification (a power feed specification associated with the charging cable). By doing so, charging control in accordance with the power feed characteristic is more readily carried out.

In each of the first charging control and the second charging control, the charging controller may transmit a power feed stop command when an amount of stored power in the power storage reaches an upper limit value. The upper limit value in the second charging control may be larger than the upper limit value in the first charging control.

Depending on the power feed characteristic, in stopping charging, reduction in current may be insufficient or stop of power feed may be delayed. Therefore, when the power feed characteristic is unknown, overcharging of the power storage is likely. When the charging cable connected to the DC inlet is not the prescribed charging cable, the charging controller estimates that the power feed characteristic is unknown and lowers the upper limit value of the amount of stored power. By doing so, overcharging of the power storage is more readily suppressed. When the charging cable connected to the DC inlet is the prescribed charging cable, the charging controller estimates that the power feed characteristic has already been known (registered) and adopts an upper limit value larger than the upper limit value in first charging control. By doing so, the power storage can be charged with more electric power while overcharging is avoided.

The amount of stored power in the power storage may be expressed, for example, with a state of charge (SOC). The SOC represents a remaining amount of stored power, and it is expressed, for example, as a ratio of a current amount of stored power to an amount of stored power in a fully charged state that ranges from 0 to 100%.

In each of the first charging control and the second charging control, while the vehicle is connected to a power feed facility outside the vehicle through a charging cable connected to the DC charging inlet, the charging controller may transmit a charging command for controlling charging power to the power feed facility. Then, in the first charging control, the charging controller may transmit the charging command with a first response delay margin to the power feed facility. In the second charging control, the charging controller may transmit the charging command with a second response delay margin smaller than the first response delay margin to the power feed facility.

When the charging cable connected to the DC inlet is not the prescribed charging cable, the charging controller estimates that the power feed characteristic is unknown and slowly carries out charging control with the first response delay margin (a large margin). By doing so, deviation between the charging command and actual charging power is less likely. When the charging cable connected to the DC inlet is the prescribed charging cable, the charging controller estimates that the power feed characteristic has already been known (registered) and carries out charging control high in immediacy with the second response delay margin (a small margin). By doing so, charging can be completed early.

Any charging controller described above may be configured to determine whether or not a charging cable connected to the DC charging inlet is the prescribed charging cable based on at least one of an identification code of the charging cable and a detection value from a cable connection detection circuit.

According to the configuration, whether or not the charging cable connected to the DC inlet of the vehicle is the prescribed charging cable can properly be determined.

The vehicle may obtain the identification code of the charging cable from the power feed facility. The identification code may be composed of at least one of a number, a sign, and a character. The detection value from the cable connection detection circuit may be a value specific to the charging cable connected to the DC inlet.

In each of the first charging control and the second charging control, the charging controller may measure an insulation resistance value of a positive electrode line of a circuit including the power storage, measure an insulation resistance value of a negative electrode line of the circuit including the power storage, and measure a voltage of the power storage, and carry out ground fault detection by using a result of each measurement.

According to the configuration, ground fault detection can easily and appropriately be carried out.

Any charging controller described above may be mounted on a portable terminal carried by a user of the vehicle or on the vehicle.

A vehicle according to a second point of view of the present disclosure includes a DC charging inlet, a power storage, and a charging controller that carries out charging control of the power storage. The charging controller is configured to carry out first charging control when a charging cable which is not a prescribed charging cable is connected to the DC charging inlet and to carry out second charging control when the prescribed charging cable is connected to the DC charging inlet. In each of the first charging control and the second charging control, while the vehicle is connected to a power feed facility outside the vehicle through a charging cable connected to the DC charging inlet, the charging controller transmits a charging command for controlling charging power to the power feed facility. In the first charging control, the charging controller transmits the charging command with a first response delay margin to the power feed facility. In the second charging control, the charging controller transmits the charging command with a second response delay margin smaller than the first response delay margin to the power feed facility.

When the charging cable connected to the DC inlet is not the prescribed charging cable, similarly to the charging controller described previously, the vehicle also slowly carries out charging control with the first response delay margin (a large margin). By doing so, deviation between the charging command and actual charging power is less likely. When the charging cable connected to the DC inlet is the prescribed charging cable, the vehicle carries out charging control high in immediacy with the second response delay margin (a small margin). By doing so, charging can be completed early.

Any vehicle described above may be an electrically powered vehicle that travels with electric power stored in the power storage. The electrically powered vehicle includes not only a battery electric vehicle (BEV) and a plug-in hybrid electric vehicle (PHEV) but also a fuel cell electric vehicle (FCEV) and a range extender EV.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
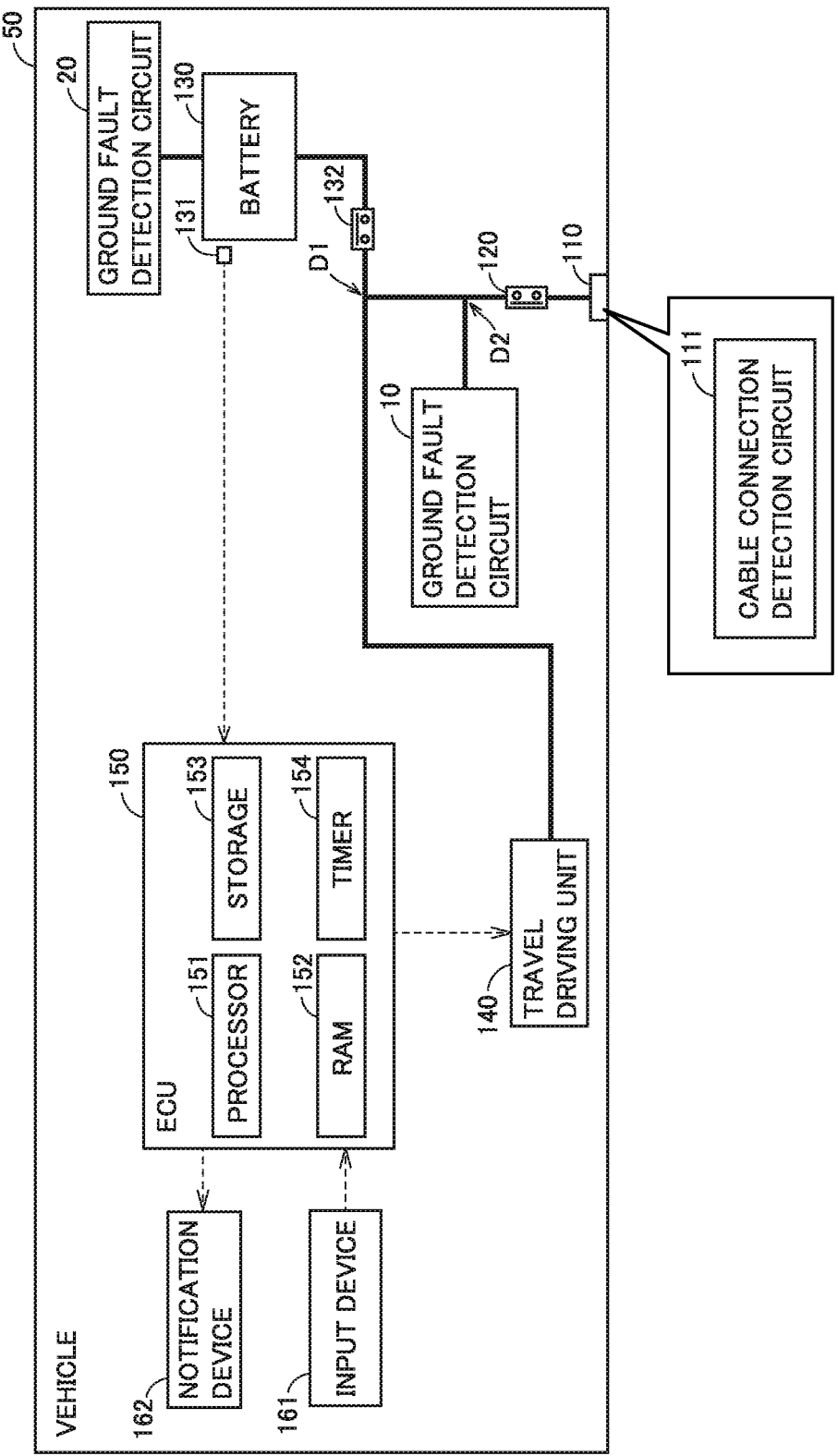
FIG. 1 is a diagram showing a configuration of a vehicle according to an embodiment of the present disclosure.

An embodiment of the present disclosure will be described in detail below with reference to the drawings. The same or corresponding elements in the drawings have the same reference characters allotted and description thereof will not be repeated.

FIG. 1 is a diagram showing a configuration of a vehicle according to this embodiment. Referring to FIG. 1, a vehicle 50 includes a battery 130 in which electric power for travel is stored. Vehicle 50 can travel with electric power stored in battery 130. Vehicle 50 includes an electronic control unit (which is referred to as an "ECU" below) 150. Vehicle 50 according to this embodiment is a battery electric vehicle (BEV) that does not include an engine (internal combustion engine).

Battery 130 includes a secondary battery such as a lithium ion battery or a nickel metal hydride battery. Battery 130 according to this embodiment is constituted of two stacks. Each stack is composed of a plurality of secondary batteries (which are generally also referred to as "cells") electrically connected to one another. The number of stacks can be modified as appropriate. Instead of the secondary battery, another power storage such as an electric double layer capacitor may be adopted. Battery 130 according to this embodiment corresponds to an exemplary "power storage" according to the present disclosure.

Vehicle 50 further includes an inlet 110 that receives electric power supplied from the outside of vehicle 50, a monitoring module 131 that monitors a state of battery 130, and a charge relay 120.

Monitoring module 131 includes various sensors that detect a state (for example, a voltage, a current, and a temperature) of battery 130 and outputs a result of detection to ECU 150. Monitoring module 131 may be a battery management system (BMS) that further performs, in addition to the sensor function, a state of charge (SOC) estimation function, a state of health (SOH) estimation function, a function to equalize a cell voltage, a diagnosis function, and a communication function. ECU 150 can obtain a state (for example, a temperature, a current, a voltage, an SOC, and an internal resistance) of battery 130 based on an output from monitoring module 131.

Vehicle 50 includes inlet 110 for contact charging. Inlet 110 corresponds to the DC inlet (DC charging inlet). A connector of a charging cable through which DC power is supplied is connected to inlet 110. Inlet 110 is constructed such that a connector of a charging cable of each of EVSE 40A and EVSE 40B which will be described later can be connected. Charge relay 120 is configured to switch between connection and disconnection of an electric power path from inlet 110 to battery 130. Vehicle 50 according to this embodiment includes only the DC inlet. Without being limited as such, an AC charging inlet (AC inlet) may be added to vehicle 50.

Inlet 110 contains a cable connection detection circuit 111. Cable connection detection circuit 111 detects connection of the charging cable to inlet 110 and provides a signal indicating detection of connection of the charging cable to ECU 150. Cable connection detection circuit 111 is configured to vary in electrical resistance (for example, a voltage divider resistance) at the time of connection of the charging cable to inlet 110. Cable connection detection circuit 111 detects connection of the charging cable based on this variation in electrical resistance.

ECU 150 includes a processor 151, a random access memory (RAM) 152, a storage 153, and a timer 154. ECU 150 may be a computer. For example, a central processing unit (CPU) may be adopted as processor 151. RAM 152 functions as a work memory that temporarily stores data to be processed by processor 151. Storage 153 can store information that is put thereinto. Storage 153 includes, for example, a read only memory (ROM) and a rewritable non-volatile memory. Storage 153 stores not only a program but also information (for example, a map, a mathematical expression, and various parameters) to be used by a program. As a program stored in storage 153 is executed by processor 151, various types of control by ECU 150 are carried out in this embodiment. Various types of control by ECU 150 are not limited to control carried out by software but can also be carried out by dedicated hardware (electronic circuitry). Any number of processors may be provided in ECU 150 and a processor may be prepared for each prescribed type of control.

Vehicle 50 includes ground fault detection circuits 10 and 20, a relay (which is referred to as a "system main relay (SMR)" below) 132, a travel driving unit 140, an input device 161, and a notification device 162.

Ground fault detection circuit 20 is connected to battery 130. An electric wire (including SMR 132) that extends from battery 130 to a side opposite to ground fault detection circuit 20 is branched at a branch point D1 into an electric wire connected to travel driving unit 140 and an electric wire extending toward inlet 110. Then, the electric wire extending toward inlet 110 is further branched at a branch point D2 into an electric wire connected to ground fault detection circuit 10 and an electric wire (including charge relay 120) connected to inlet 110. A circuit configuration of ground fault detection circuits 10 and 20 and a periphery thereof will be described later (see FIG. 4).

SMR 132 is located between branch point D1 and battery 130. SMR 132 is configured to switch between connection and disconnection of an electric power path from battery 130. SMR 132 is closed (connected) when vehicle 50 travels. SMR 132 is closed also during external charging of battery 130.

Travel driving unit 140 includes a power control unit (PCU) and a motor generator (MG) which are not shown, and allows vehicle 50 to travel with electric power stored in battery 130. The PCU includes, for example, an inverter and a converter (neither of which is shown). The PCU is controlled by ECU 150. The MG is implemented, for example, by a three-phase AC motor generator. The MG is driven by the PCU and rotates a drive wheel of vehicle 50. The PCU drives the MG with electric power supplied from battery 130. The MG performs regeneration and supplies regenerated electric power to battery 130.

Input apparatus 161 accepts an input from a user. Input apparatus 161 is operated by a user and outputs a signal corresponding to the operation by the user to ECU 150. Examples of input apparatus 161 include various switches, various pointing devices, a keyboard, and a touch panel. Input apparatus 161 may include a smart speaker that accepts audio input.

Notification device 162 is configured to give a notification to a user. ECU 150 can give information to the user through notification device 162. Examples of notification device 162 include various displays. Any notification method is applicable; a notification may be given by representation on a display device (for example, representation of a character or an image), by sound (including voice and sound) through a speaker, or by turn-on (including flashing) of a prescribed indicator.

Figure 2:
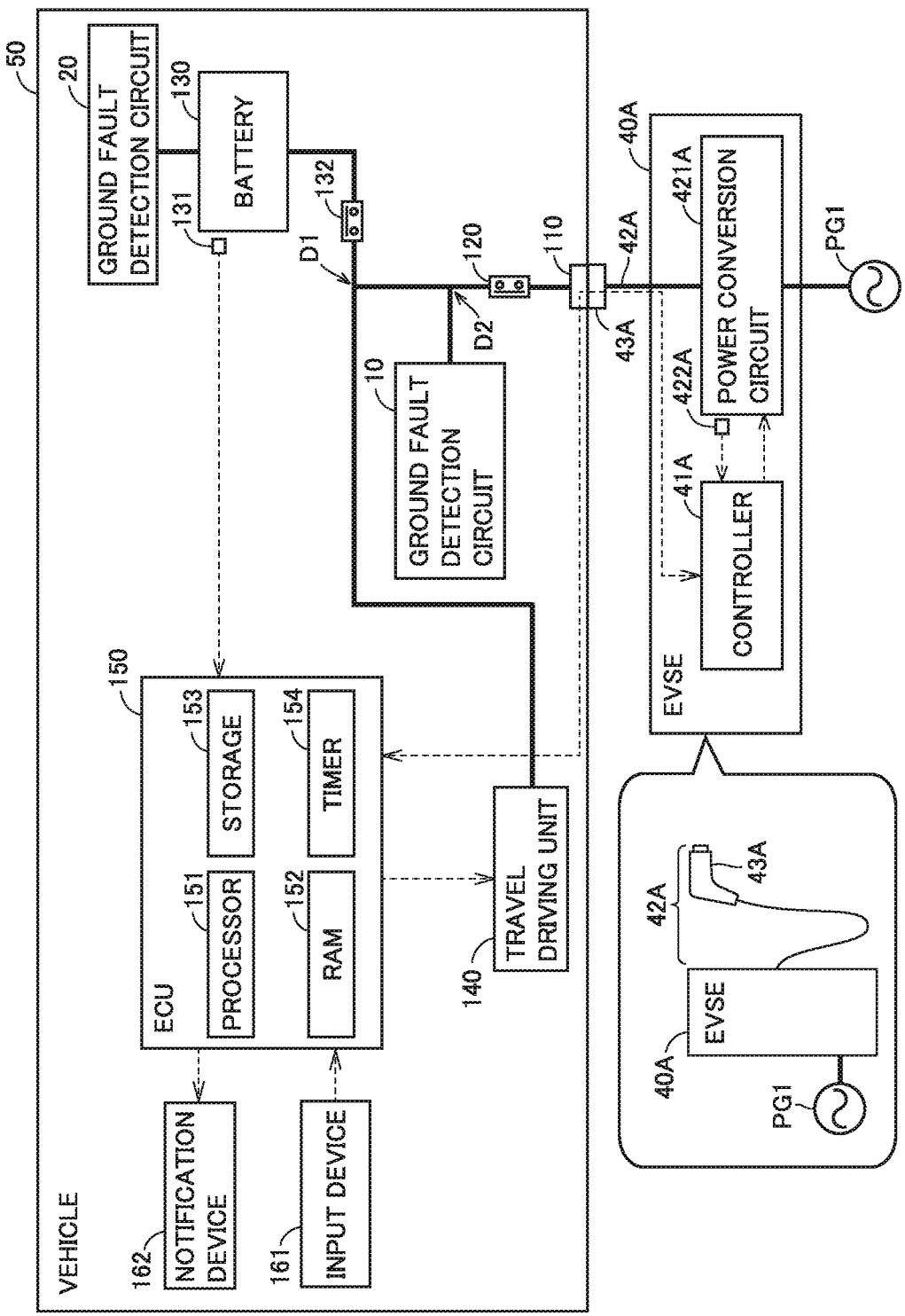
FIG. 2 is a diagram showing a state that the vehicle shown in FIG. 1 and a first power feed facility are electrically connected to each other.
Figure 3:
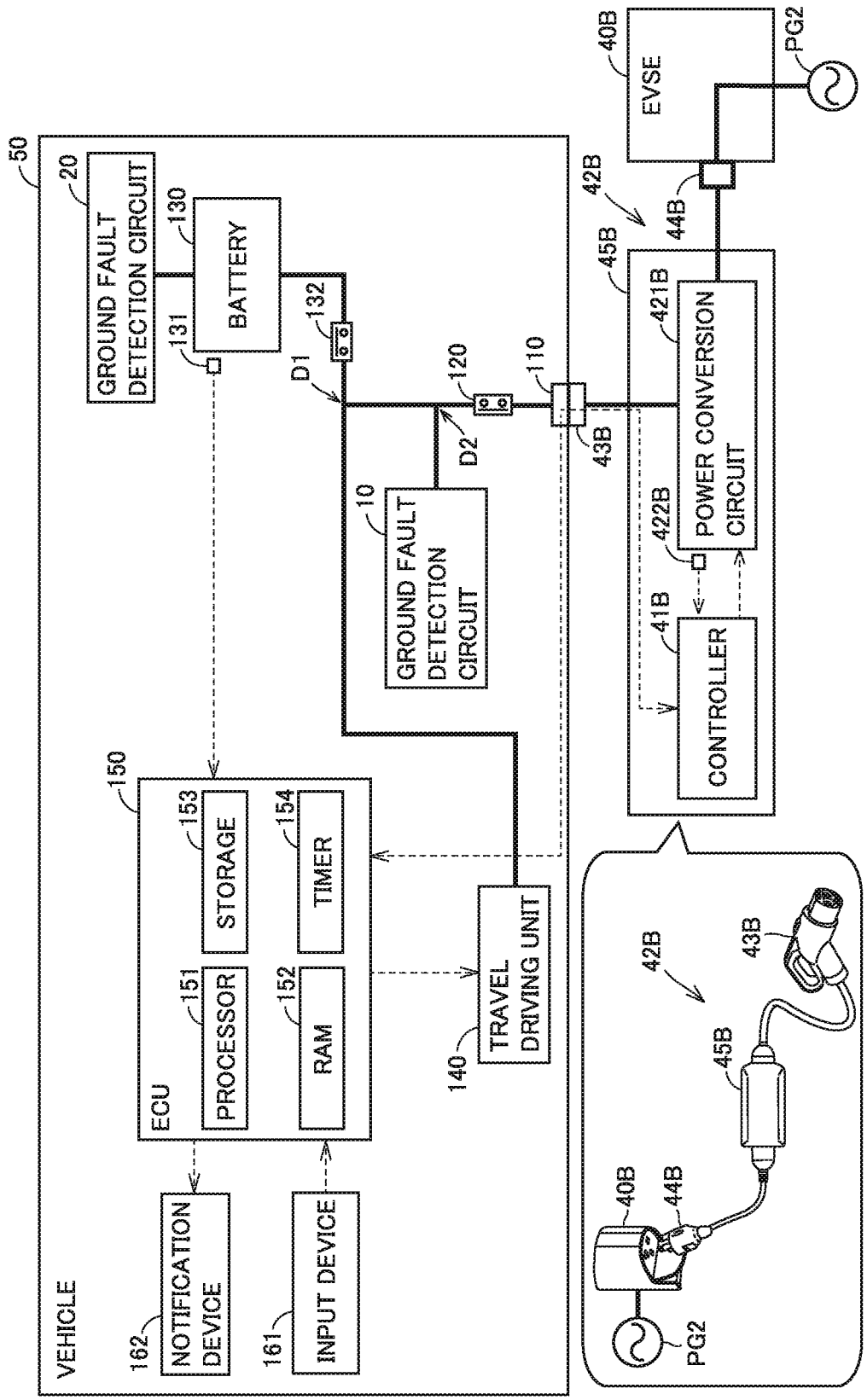
FIG. 3 is a diagram showing a state that the vehicle shown in FIG. 1 and a second power feed facility are electrically connected to each other.

Vehicle 50 shown in FIG. 1 is configured to be connected to both of EVSE 40A shown in FIG. 2 and EVSE 40B shown in FIG. 3. "EVSE" stands for electric vehicle supply equipment. The EVSE corresponds to a power feed facility outside the vehicle. Each of EVSE 40A and EVSE 40B is a DC power feed facility (a DC type power feed facility) that provides DC power. EVSE 40A and EVSE 40B will be described below with reference to FIGS. 2 and 3, respectively.

FIG. 2 is a diagram showing a state that vehicle 50 and EVSE 40A are electrically connected to each other. Referring to FIG. 2, an external power supply PG1 supplies electric power for quick charging to EVSE 40A. External power supply PG1 supplies AC power to EVSE 40A. EVSE 40A is, for example, public EVSE that a large number of unspecified users are permitted to use.

EVSE 40A includes a controller 41A that carries out power feed control, a power conversion circuit 421A, and a monitoring module 422A that monitors a state of power conversion circuit 421A. A charging cable 42A is connected to EVSE 40A. Though charging cable 42A is always connected to EVSE 40A in this embodiment, it may be attachable to and removable from EVSE 40A. Charging cable 42A includes a DC power connector 43A (which is referred to as a "DC connector 43A" below) at its tip end and contains a power line and a communication line. DC connector 43A is constructed to be connected to inlet 110 of vehicle 50. EVSE 40A provides DC power to DC connector 43A.

Controller 41A may be a computer. Controller 41A includes a processor and is configured to control power conversion circuit 421A. Power conversion circuit 421A converts AC power supplied from external power supply PG1 into DC power and provides DC power to DC connector 43A. Power conversion circuit 421A is controlled by controller 41A.

Monitoring module 422A includes various sensors that detect a state of power conversion circuit 421A and provides a result of detection to controller 41A. In this embodiment, monitoring module 422A is configured to detect a voltage and a current provided from power conversion circuit 421A. Monitoring module 422A is configured to detect power fed from EVSE 40A.

FIG. 3 is a diagram showing a state that vehicle 50 and EVSE 40B are electrically connected to each other. Referring to FIG. 3, EVSE 40B is, for example, household EVSE installed in a house. An external power supply PG2 is a household power supply that supplies AC power to the house. External power supply PG2 supplies electric power not only to EVSE 40B but also to a not-shown panelboard in the house (that is, a panelboard connected to wires in the house). External power supply PG2 may be a power grid (for example, a large-scale power grid provided as an infrastructure) provided by an electric power company or a microgrid. External power supply PG2 supplies electric power lower than external power supply PG1 shown in FIG. 2 to EVSE 40B. Therefore, EVSE 40B is lower in class-Y capacitor capacitance (floating capacitance) of a high-voltage line than EVSE 40A shown in FIG. 2. External power supply PG2 supplies AC power to EVSE 40B.

EVSE 40B is electrically connected to vehicle 50 through a charging cable 42B. Charging cable 42B includes an AC power plug 44B (which is referred to as an "AC plug 44B" below) located at a first end, a DC power connector 43B (which is referred to as a "DC connector 43B" below) located at a second end opposite to the first end, and a control box 45B located between AC plug 44B and DC connector 43B. DC connector 43B is constructed to be connected to inlet 110 of vehicle 50. AC plug 44B is constructed to be connected to a receptacle of EVSE 40B. AC power supplied from external power supply PG2 to EVSE 40B is provided to the receptacle of EVSE 40B. Charging cable 42B receives AC power provided from the receptacle of EVSE 40B at AC plug 44B and carries out AC/DC conversion in control box 45B so that DC power is provided to DC connector 43B.

Controller 41B that carries out power feed control is contained not in a main body of EVSE 40B but in control box 45B. Control box 45B contains a power conversion circuit 421B and a monitoring module 422B. Power conversion circuit 421B and monitoring module 422B perform functions comparable to the functions of power conversion circuit 421A and monitoring module 422A shown in FIG. 2, respectively. Controller 41B may be a computer. Controller 41B includes a processor and is configured to control power conversion circuit 421B. Monitoring module 422B includes various sensors that detect a state (for example, an output voltage and an output current) of power conversion circuit 421B and provides a result of detection to controller 41B. Power conversion circuit 421B converts AC power supplied from the receptacle of EVSE 40B into DC power and provides DC power to DC connector 43B. Power conversion circuit 421B includes, for example, an inverter. Power conversion circuit 421B may include at least one of a rectification circuit, a power factor correction (PFC) circuit, an insulating circuit, a transformer (for example, an insulating transformer), and a filter circuit. Power conversion circuit 421B corresponds to an exemplary "AC/DC conversion circuit" according to the present disclosure.

As the connector of the charging cable connected to the EVSE is connected to (plugged into) inlet 110 of parked vehicle 50, vehicle 50 enters a plugged-in state. In the plugged-in state, the controller on a side of vehicle 50 and the controller on a side of the EVSE can communicate with each other and electric power can be supplied and received between the EVSE and vehicle 50.

For example, in the plugged-in state shown in FIG. 2, ECU 150 and controller 41A can communicate with each other. In the plugged-in state shown in FIG. 3, ECU 150 and controller 41B can communicate with each other. Communication between ECU 150 of vehicle 50 and the controller (for example, controller 41A or 41B) on the side of the EVSE may be of any type, and for example, controller area network (CAN) or PLC may be adopted.

In vehicle 50 in the plugged-in state, external charging (that is, charging of battery 130 with electric power supplied from the EVSE) can be carried out. Electric power for external charging is supplied from the EVSE through the charging cable to inlet 110. In external charging, charge relay 120 is closed (connected), and when external charging is not carried out, charge relay 120 is opened (disconnected).

EVSE 40A and EVSE 40B are described above. Details of the configuration of ground fault detection circuits 10 and 20 will now be described with reference to FIG. 4. Each of EVSE 40A and EVSE 40B is referred to as "EVSE 40" below, each of charging cables 42A and 42B is referred to as "charging cable 42" below, and each of DC connectors 43A and 43B is referred to as "DC connector 43" below, unless they are described as being distinguished from each other.

Figure 4:
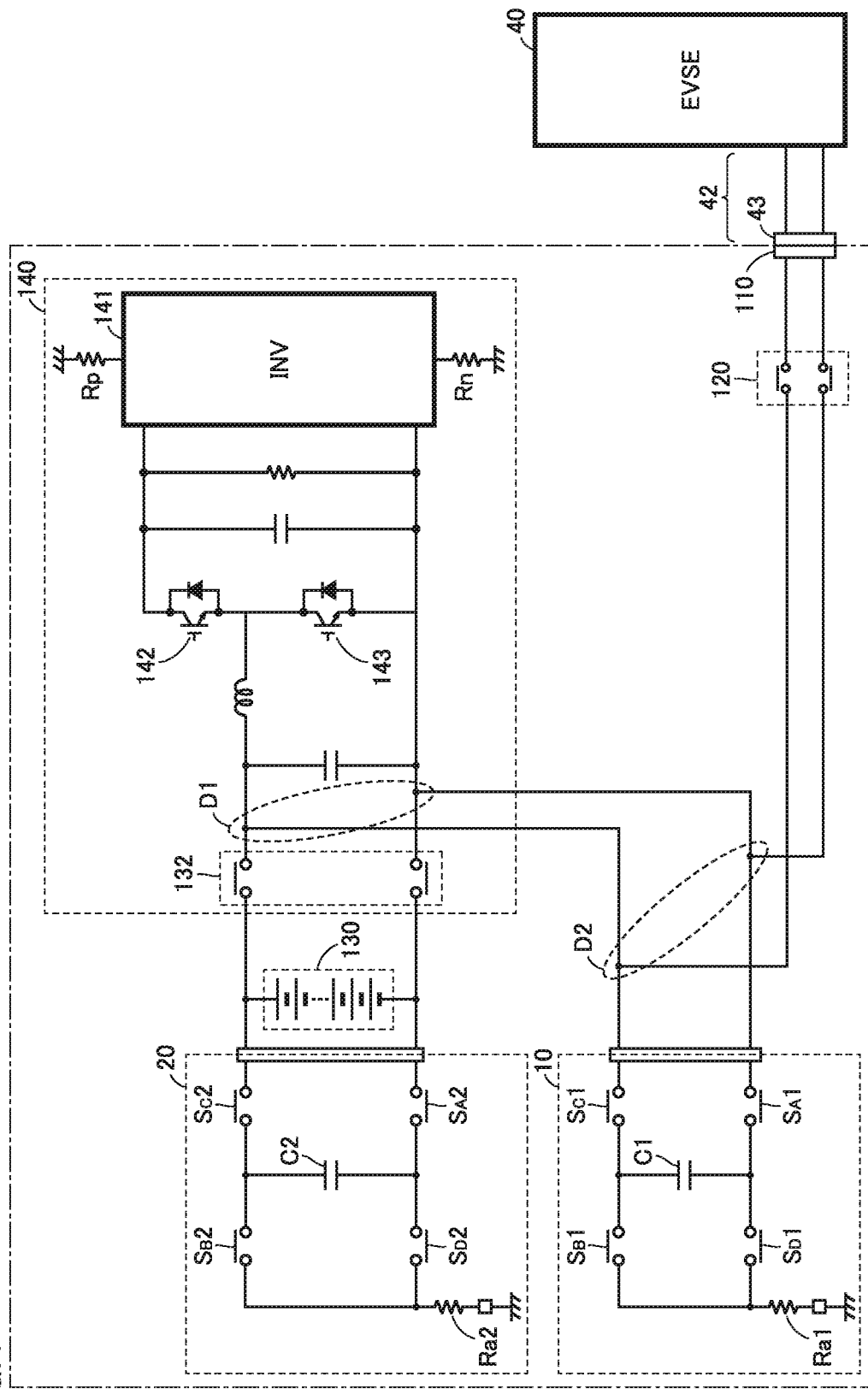
FIG. 4 is a diagram showing a circuit configuration of first and second ground fault detection circuits and a periphery thereof according to the embodiment of the present disclosure.

FIG. 4 is a diagram showing a circuit configuration of ground fault detection circuits 10 and 20 and a periphery thereof. Referring to FIG. 4, ground fault detection circuit 10 includes a capacitor C1 and switches $S_A1$, $S_B1$, $S_C1$, and $S_D1$ controlled by ECU 150. Ground fault detection circuit 20 includes a capacitor C2 and switches $S_A2$, $S_B2$, $S_C2$, and $S_D2$ controlled by ECU 150. Electrical resistances Ra1 and Ra2 are circuit resistances of ground fault detection circuits 10 and 20, respectively, and correspond to electrical resistances between ground fault detection circuits 10 and 20 and the ground (for example, a body of vehicle 50).

Capacitances of capacitors C1 and C2 are set in accordance with detection time periods of ground fault detection circuits 10 and 20, respectively. In this embodiment, ground fault detection circuit 20 is shorter in detection time period than ground fault detection circuit 10. Therefore, capacitor C2 is lower in capacitance than capacitor C1. A ground fault detection method will be described later. Ground fault detection circuit 10 and ground fault detection circuit 20 may simply be referred to as a "detection circuit 10" and a "detection circuit 20" below, respectively. Detection circuit 10 and detection circuit 20 correspond to an exemplary "first ground fault detection circuit" and an exemplary "second ground fault detection circuit" according to the present disclosure, respectively.

Travel driving unit 140 (more specifically, a PCU) includes an inverter 141 and switches 142 and 143 that are controlled by ECU 150. Switches 142 and 143 implement a converter. Each of switches 142 and 143 is a semiconductor relay such as a transistor. While vehicle 50 is not traveling, each of switches 142 and 143 may be maintained in a disconnected state. A diode is connected in anti-parallel to each of switches 142 and 143. Each of electrical resistances Rp and Rn is an electrical resistance between the PCU and the ground (for example, the body of vehicle 50). Electrical resistances Rp and Rn correspond to circuit resistances on a positive electrode side and a negative electrode side of the PCU, respectively.

Each of capacitors C1 and C2 is referred to as a "capacitor C" below, each of switches $S_A1$ and $S_A2$ is referred to as "$S_A$" below, each of switches $S_B1$ and $S_B2$ is referred to as "$S_B$" below, each of switches $S_C1$ and $S_C2$ is referred to as "$S_C$" below, and each of switches $S_D1$ and $S_D2$ is referred to as "$S_D$" below, unless they are described as being distinguished from each other. In each ground fault detection circuit, capacitor C has a first end connected between $S_A$ and $S_D$ and a second end connected between $S_B$ and $S_C$. $S_A$ is located between the first end of capacitor C and a negative electrode of battery 130 and $S_C$ is located between the second end of capacitor C and a positive electrode of battery 130.

ECU 150 determines whether or not ground fault has occurred based on an insulation resistance of a circuit. ECU 150 is configured to carry out ground fault detection of a circuit to be subjected to ground fault detection (which is also referred to as a "subject circuit" below) by measuring the insulation resistance while the subject circuit is connected to the ground fault detection circuit (detection circuit 10 or 20). In this embodiment, ECU 150 is configured to measure the insulation resistance in each circuit while it controls $S_A$, $S_B$, $S_C$, and $S_D$ to switch among first to third circuits which will be described below.

The first circuit is a circuit in which capacitor C has the first end directly connected to the negative electrode of battery 130 and has the second end connected to the positive electrode of battery 130 with the subject circuit being interposed. The second circuit is a circuit in which capacitor C has the second end directly connected to the positive electrode of battery 130 and has the first end connected to the negative electrode of battery 130 with the subject circuit being interposed. The third circuit is a circuit in which capacitor C has the first end and the second end directly connected to the negative electrode and the positive electrode of battery 130, respectively. The subject circuit in this embodiment is the PCU (travel driving unit 140) or EVSE 40.

In this embodiment, $S_A$, $S_B$, $S_C$, and $S_D$ in each ground fault detection circuit are configured to switch among the first to third circuits. Each of $S_A$, $S_B$, $S_C$, and $S_D$ may be an electromagnetic mechanical relay or a semiconductor relay. Operations of $S_A$, $S_B$, $S_C$, and $S_D$ will be described below with reference to FIGS. 5 to 7. An example in which ground fault detection is carried out with the use of detection circuit 20 during travel of vehicle 50 will mainly be described below. Ground fault detection can basically be carried out in a manner described below also when ground fault detection is carried out with the use of any one of detection circuits 10 and 20 during external charging of battery 130.

ECU 150 measures an insulation resistance value (which is denoted as "Rp" below) of a positive electrode line of the subject circuit, measures an insulation resistance value (which is denoted as "Rn" below) of a negative electrode line of the subject circuit, and measures a voltage of battery 130, and finds a circuit resistance (which is denoted as "Ra" below) of the ground fault detection circuit. Then, when the measured insulation resistance value (for example, at least one of Rp, Rn, and Ra) is smaller than a reference value, ECU 150 determines that ground fault has occurred. In this embodiment, a total value (which is denoted as "VL1+VL2"

below) of two stack voltages corresponds to the voltage of battery 130. Measurement of Rp, measurement of Rn, and measurement of VL1+VL2 (the voltage of battery 130) are referred to as "first measurement," "second measurement," and "third measurement" below, respectively. In this embodiment, first measurement, second measurement, and third measurement are conducted in this order.

Figure 5:
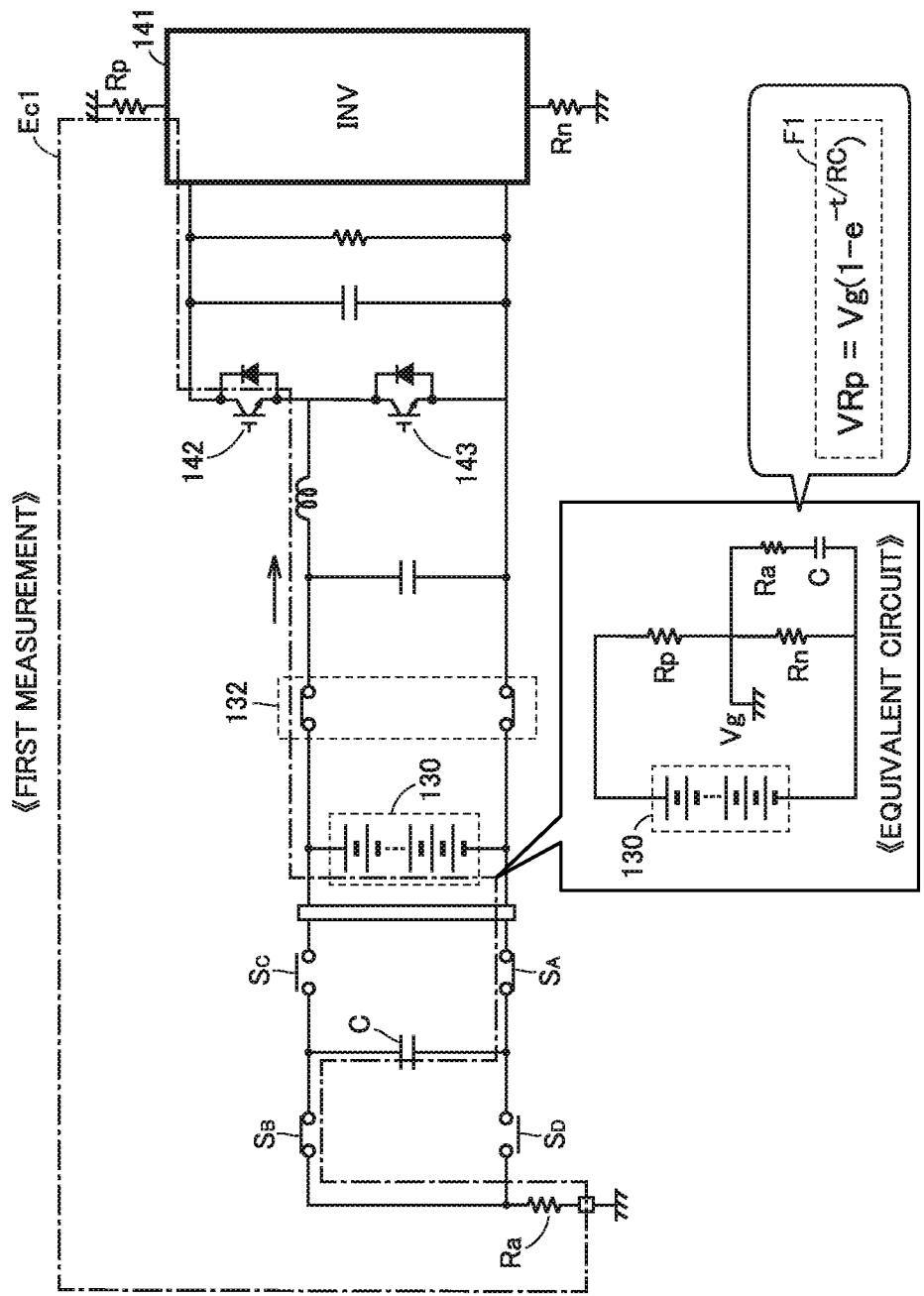
FIG. 5 is a diagram for illustrating first measurement in a ground fault detection method according to the embodiment of the present disclosure.

FIG. 5 is a diagram for illustrating first measurement. Referring to FIG. 5, in first measurement, ECU 150 sets each of SMR 132, $S_A$, and $S_B$ to the closed state and sets each of $S_C$ and $S_D$ to the open state. A circuit Ec1 including battery 130 and capacitor C is thus formed. Circuit Ec1 corresponds to the first circuit described previously. Circuit Ec1 shown in FIG. 5 includes the positive electrode line of the subject circuit (for example, the PCU of travel driving unit 140 shown in FIG. 5). When ground fault detection is carried out during charging of battery 130 with the use of EVSE 40, the circuit including the positive electrode line of EVSE 40 is formed as circuit Ec1.

ECU 150 has capacitor C charged for a prescribed period of time while circuit Ec1 described above is formed, and thereafter it measures a charge voltage of capacitor C and measures Rp (the insulation resistance value of the positive electrode line of the subject circuit). The charge voltage of capacitor C measured in first measurement is denoted as "VRp" below. Circuit Ec1 can be represented as an equivalent circuit shown in FIG. 5. An expression F1 associated with this equivalent circuit will be described later.

Figure 6:
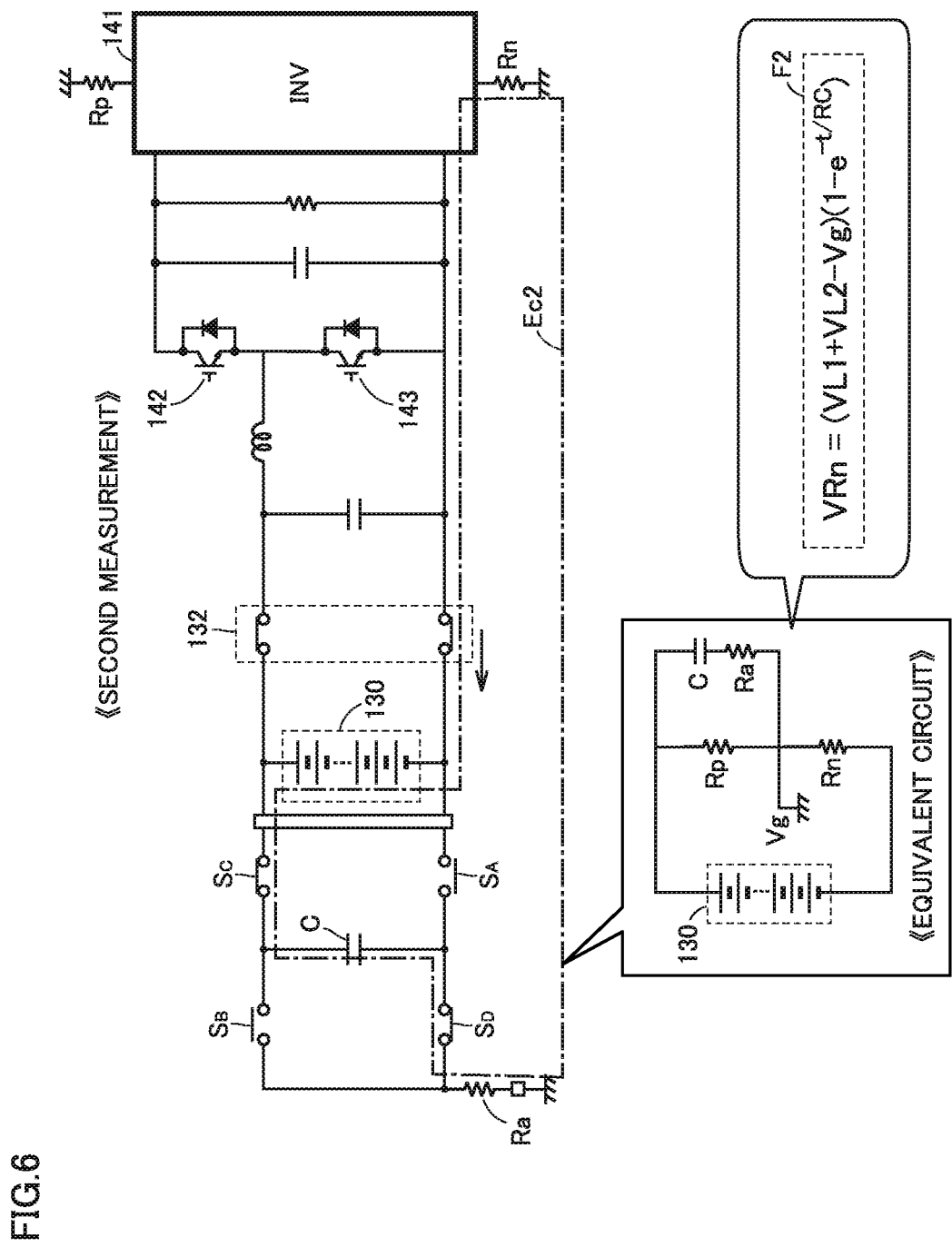
FIG. 6 is a diagram for illustrating second measurement in the ground fault detection method according to the embodiment of the present disclosure.

FIG. 6 is a diagram for illustrating second measurement. Referring to FIG. 6, in second measurement, ECU 150 sets each of SMR 132, $S_C$, and $S_D$ to the closed state and sets each of $S_A$ and $S_B$ to the open state. A circuit Ec2 including battery 130 and capacitor C is thus formed. Circuit Ec2 corresponds to the second circuit described previously. Circuit Ec2 shown in FIG. 6 includes a negative electrode line of the subject circuit (for example, the PCU of travel driving unit 140 shown in FIG. 6). When ground fault detection is carried out during charging of battery 130 with the use of EVSE 40, the circuit including the negative electrode line of EVSE 40 is formed as circuit Ec2.

ECU 150 has capacitor C charged for a prescribed period of time while circuit Ec2 described above is formed, and thereafter it measures a charge voltage of capacitor C and measures Rn (the insulation resistance value of the negative electrode line of the subject circuit). The charge voltage of capacitor C measured in second measurement is denoted as "VRn" below. Circuit Ec2 can be represented as an equivalent circuit shown in FIG. 6. An expression F2 associated with this equivalent circuit will be described later.

Figure 7:
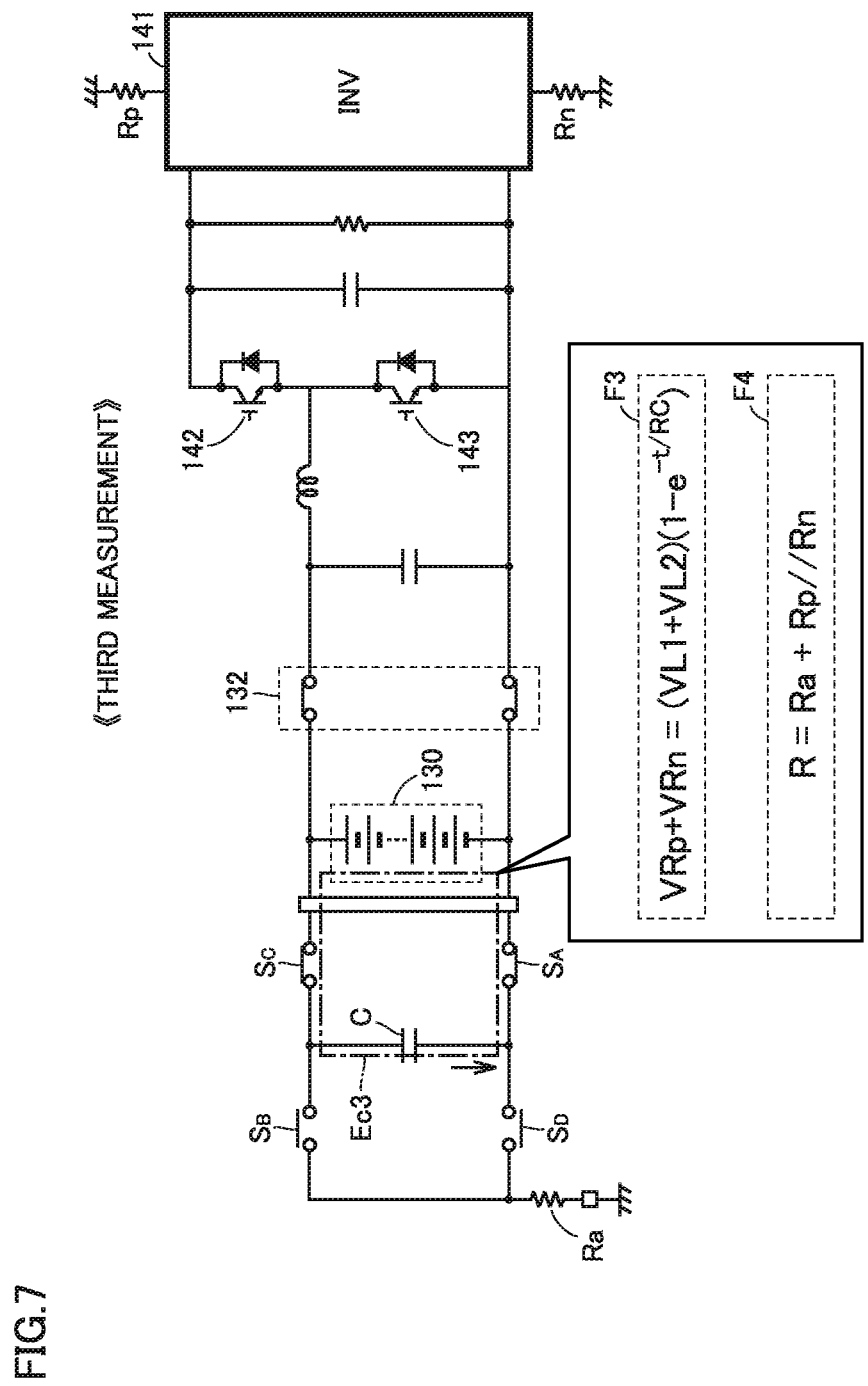
FIG. 7 is a diagram for illustrating third measurement in the ground fault detection method according to the embodiment of the present disclosure.

FIG. 7 is a diagram for illustrating third measurement. Referring to FIG. 7, in third measurement, ECU 150 sets each of SMR 132, $S_A$, and $S_C$ to the closed state and sets each of $S_B$ and $S_D$ to the open state. A circuit Ec3 including battery 130 and capacitor C is thus formed. Circuit Ec3 corresponds to the third circuit described previously. While circuit Ec3 is formed, ECU 150 has capacitor C charged for a prescribed period of time, and thereafter measures VL1+VL2 (a voltage of battery 130). In this embodiment, a time period for charging of capacitor C is equal among first to third measurements. The charging time period in ground fault detection with the use of detection circuit 20 is shorter than the charging time period in ground fault detection with the use of detection circuit 10.

Expressions F1 to F4 shown in FIGS. 5 to 7 will be described below. In each of expressions F1 and F2, Vg represents a body potential of vehicle 50 (the reference of a minus potential). In each of expressions F1 to F3, "C" means a capacitance of capacitor C and "t" means a time period for charging of capacitor C. As shown in expression F4, R (an insulation resistance value of the entire circuit) in expressions F1 to F3 corresponds to the sum of Ra (the circuit resistance of the ground fault detection circuit) and Rp//Rn (an insulation resistance of the subject circuit).

Relation between VRp and R can be expressed in a prescribed first relational expression (for example, expression F1 shown in FIG. 5). Relation among VRn, VL1+VL2, and R can be expressed in a prescribed second relational expression (for example, expression F2 shown in FIG. 6). Furthermore, relation among VRp, VRn, VL1+VL2, and R can be expressed in a prescribed third relational expression (for example, expression F3 shown in FIG. 7). Expression F3 is derived from expressions F1 and F2. In this embodiment, ECU 150 calculates Rp, Rn, and Ra by using expressions F1 to F4 and results of first to third measurements (for example, VRp, VRn, and VL1+VL2). Then, when at least one of Rp, Rn, and Ra is smaller than the reference value, ECU 150 determines that ground fault has occurred.

ECU 150 repeatedly conducts the first to third measurements on a prescribed detection cycle during travel of vehicle 50 and during external charging of battery 130, and carries out ground fault detection based on measured Rp, Rn, and Ra. The detection cycle corresponds to a time period for detection carried out once. ECU 150 carries out ground fault detection with detection circuit 20 during travel of vehicle 50. Detection circuit 20 corresponds to a ground fault detection circuit for travel. During external charging of battery 130, ECU 150 selects any one of detection circuits 10 and 20 and carries out ground fault detection with the selected ground fault detection circuit. Detection circuit 10 corresponds to a ground fault detection circuit for charging. A method of selecting a ground fault detection circuit will be described later.

When ECU 150 carries out ground fault detection with detection circuit 10, it conducts the first to third measurements on a prescribed first cycle, and when ECU 150 carries out ground fault detection with detection circuit 20, it conducts the first to third measurements on a prescribed second cycle. In this embodiment, the first cycle is longer than the second cycle. In one example, the first cycle is set to approximately one hundred seconds and the second cycle is set to approximately ten seconds.

For detection circuit 10 (ground fault detection circuit for charging), elements are designed to address ground fault detection during external charging with the use of a power feed facility high in floating capacitance. Detection circuit 10 according to this embodiment can appropriately carry out ground fault detection during external charging with the use of the power feed facility (including EVSE 40A) of the type shown in FIG. 2. For charging by the floating capacitance (capacitor component) of the power feed facility, a long detection time period (charging time period) is set for detection circuit 10. For detection circuit 20 (ground fault detection circuit for travel), elements are designed to address ground fault detection during travel of the vehicle. Such detection circuit 20 can address also ground fault detection during external charging with the use of a power feed facility low in floating capacitance. Detection circuit 20 according to this embodiment can appropriately carry out ground fault detection during external charging with the use of the power feed facility (including EVSE 40B) of the type shown in FIG. 3.

Referring again to FIG. 1, information on a charging cable that can be connected to inlet 110 is registered in advance in storage 153 of ECU 150. The charging cable registered in storage 153 may be referred to as a "registered cable" below and information on the charging cable registered in storage 153 may be referred to as "registered information" below.

In this embodiment, a charging cable (a charging cable including an AC/DC conversion circuit) employed in the power feed facility of the type shown in FIG. 3 is defined as the registered cable, and a charging cable (that is, a charging cable not including an AC/DC conversion circuit) employed in the power feed facility of the type shown in FIG. 2 is not defined as the registered cable. When a plurality of charging cables are registered in storage 153, registered information is stored in storage 153 as being distinguished for each registered cable. In this embodiment, an identification code of the registered cable, a resistance value (detection value) from cable connection detection circuit 111 at the time of detection of connection of the registered cable, and the power feed specification corresponding to the registered cable are included in the registered information. In this embodiment, when the registered cable is connected to inlet 110, cable connection detection circuit 111 detects a resistance value specific to the registered cable. The identification code may be a code (for example, a number) set by an EVSE manufacturer or a charging cable manufacturer. The power feed specification corresponding to the registered cable is a power feed specification for power feed with the use of the registered cable. For example, the power feed specification corresponding to charging cable 42B shown in FIG. 3 shows a power feed characteristic in power feed from external power supply PG2 through EVSE 40B and charging cable 42B to vehicle 50.

The registered information may have already been registered in storage 153 in an initial state (for example, shipment) of vehicle 50. Alternatively, a user may be permitted to add the registered information into storage 153, for example, through input device 161. The power feed specification (the power feed specification corresponding to the registered cable) registered in storage 153 may be referred to as a "registered specification" below.

The registered specification is stored in storage 153 as above. The registered specification corresponds to the power feed specification associated with the prescribed charging cable (registered cable). In addition to the registered specification, a standard specification of a DC power feed facility (direct-current power feed facility) that can feed power to inlet 110 of vehicle 50 is further stored in storage 153.

ECU 150 is configured to carry out first charging control when a charging cable which is not the registered cable is connected to inlet 110 of vehicle 50 and to carry out second charging control when the registered cable is connected to inlet 110. Each of first charging control and second charging control is control for charging battery 130 with DC power supplied from EVSE (outside of vehicle 50) to inlet 110. More specifically, in each of first charging control and second charging control, ECU 150 transmits a charging command for controlling charging power to the EVSE in the plugged-in state (that is, a state that vehicle 50 is connected to the EVSE through the charging cable connected to inlet 110). Then, the EVSE carries out power feed control in accordance with the charging command. First charging control is charging control corresponding to the standard specification. Second charging control is charging control corresponding to the registered specification. ECU 150 according to this embodiment corresponds to an exemplary "charging controller" according to the present disclosure.

The power feed specification (the standard specification and the registered specification) stored in storage 153 includes responsiveness (a response speed) to the charging command, followability (an error in a current) to the charging command, stability in power feed, power feed reduction performance, and the floating capacitance of the power feed facility. Responsiveness to the charging command, followability to the charging command, and power feed reduction performance tend to vary depending on performance of the power conversion circuit, and hence they may be shown in a specification of the power conversion circuit (for example, specifications of power conversion circuits 421A and 421B). Since followability to the charging command and stability in power feed tend to vary depending on performance of the power supply, they may be shown in a specification of the power supply (for example, specifications of external power supplies PG1 and PG2). Each of the standard specification and the registered specification may show a response delay margin which will be described later, a type of the ground fault detection circuit, and an SOC upper limit value.

Figure 8:
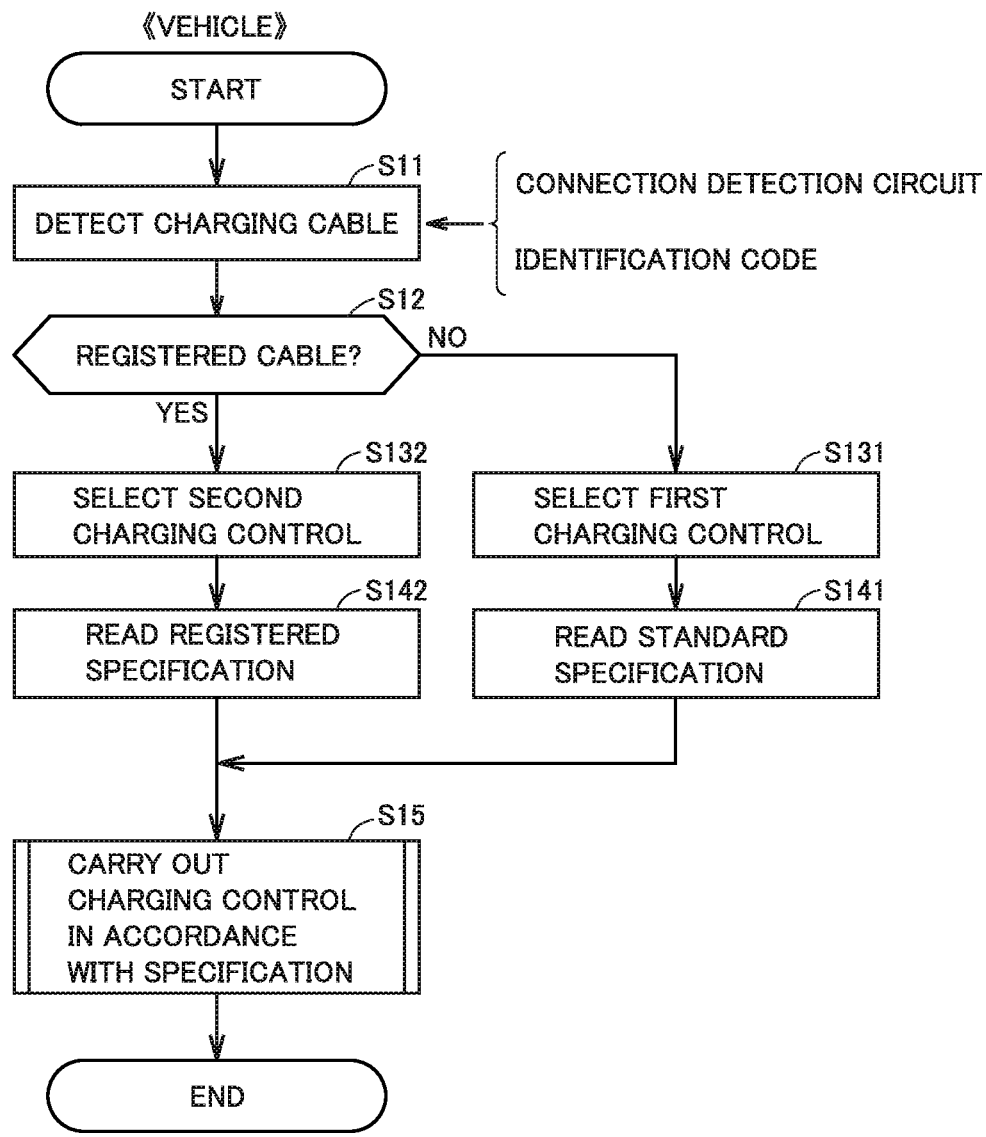
FIG. 8 is a flowchart showing processing involved with estimation of a power feed characteristic in a charging method according to the embodiment of the present disclosure.

FIG. 8 is a flowchart showing processing performed in vehicle 50 during charging. Processing shown in this flowchart is started, for example, when vehicle 50 and EVSE are connected to each other through the charging cable and vehicle 50 enters the plugged-in state. Each step in the flowchart is simply denoted as "S" below.

Referring to FIG. 8 together with FIG. 1, in S11, ECU 150 detects the charging cable. Specifically, ECU 150 obtains information (which is also referred to as "specifying information" below) for specifying the charging cable connected to inlet 110. In this embodiment, ECU 150 obtains as the specifying information, the identification code of the charging cable and a detection value (resistance value) from cable connection detection circuit 111. ECU 150 obtains the identification code of the charging cable from the EVSE, for example, through communication with the controller on the EVSE side.

In S12, ECU 150 determines whether or not the charging cable connected to inlet 110 is the registered cable based on the specifying information. For example, when ECU 150 checks the specifying information obtained in S11 against the registered information within storage 153 and the specifying information indicates the charging cable as the registered cable, ECU 150 makes determination as YES in S12. In this embodiment, when the charging cable connected to inlet 110 is the charging cable of the type shown in FIG. 2 (that is, the charging cable not including the AC/DC conversion circuit), determination as NO is made in S12. Even when the charging cable connected to inlet 110 is the charging cable of the type shown in FIG. 3 (that is, the charging cable including the AC/DC conversion circuit), determination as NO is made in S12 unless it is registered in storage 153.

When the charging cable connected to inlet 110 is not the registered cable (NO in S12), in S131, ECU 150 selects first charging control described previously as a control mode, and in S141, ECU 150 reads the standard specification described previously from storage 153. Thereafter, the process proceeds to S15.

When the charging cable connected to inlet 110 is the registered cable (YES in S12), in S132, ECU 150 selects second charging control described previously as the control mode, and in S142, ECU 150 reads the registered specification described previously from storage 153. Thereafter, the process proceeds to S15.

Figure 9:
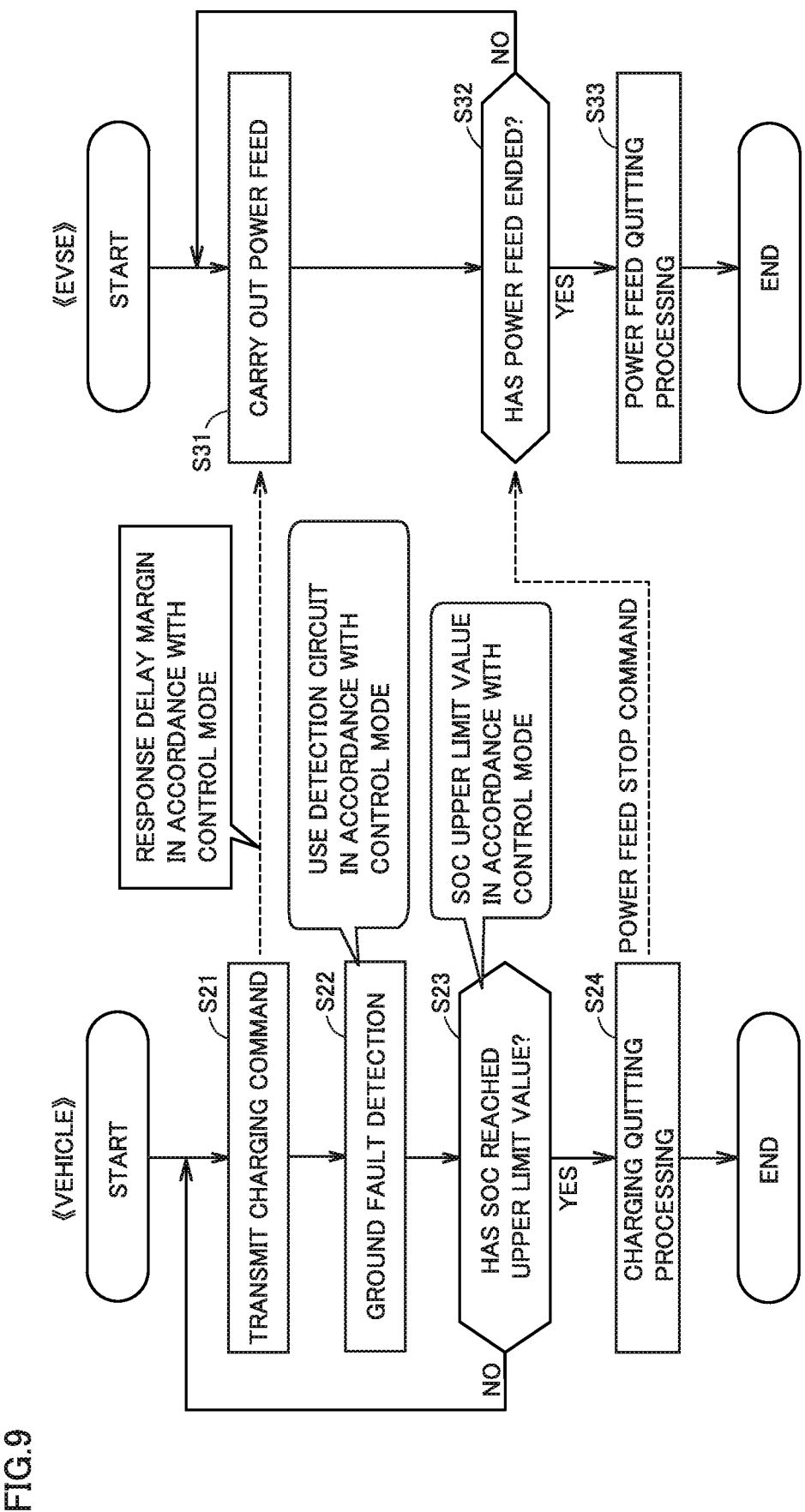
FIG. 9 is a flowchart showing details of processing involved with charging control shown in FIG. 8.

In S15, ECU 150 sets each of charge relay 120 and SMR 132 to the closed state and carries out charging control corresponding to the read power feed specification (standard specification/registered specification) in the selected control mode (first charging control/second charging control). ECU 150 may control notification device 162 to notify a user of which of first charging control and second charging control is carried out. FIG. 9 is a flowchart for illustrating details of charging control in S15.

Referring to FIG. 9 together with FIG. 1, in S21, ECU 150 of vehicle 50 transmits the charging command for controlling charging power to the controller on the EVSE side. At this time, ECU 150 sets a response delay margin for the charging command in accordance with the control mode (first charging control/second charging control). In first charging control, ECU 150 transmits the charging command with a first response delay margin shown in the standard specification to EVSE. In second charging control, ECU 150 transmits the charging command with a second response delay margin shown in the registered specification to EVSE. The second response delay margin is smaller than the first response delay margin. When the registered cable is connected to inlet 110, ECU 150 carries out second charging control, and in S21, ECU 150 carries out charging control high in immediacy, with an already known response delay margin (small margin) registered in storage 153. By doing so, charging can be completed early. In one example, the first response delay margin is set to approximately one minute and the second response delay margin is set to approximately one second.

In S31, the controller on the EVSE side (for example, controller 41A shown in FIG. 2 or controller 41B shown in FIG. 3) carries out power feed control in accordance with the charging command from ECU 150. Electric power for charging battery 130 is thus supplied from the EVSE to vehicle 50 and external charging of battery 130 is carried out. Then, in S32, the controller on the EVSE side determines whether or not to quit power feed, and continues power feed until determination as YES (end of power feed) is made in S32.

ECU 150 of vehicle 50 repeatedly performs S21 to S23 during external charging of battery 130. In S22, ECU 150 carries out ground fault detection during charging of battery 130 with the ground fault detection circuit in accordance with the control mode (first charging control/second charging control). In first charging control, ground fault detection is carried out with the use of detection circuit 10. In second charging control, ground fault detection is carried out with the use of detection circuit 20. In this embodiment, the charging cable employed in the power feed facility (for example, EVSE 40B shown in FIG. 3) corresponding to detection circuit 20 is set in advance as the registered cable in storage 153. When such a charging cable is connected to inlet 110, ECU 150 carries out second charging control, and in S22, carries out ground fault detection with detection circuit 20 short in detection time period. By doing so, ground fault detection can be carried out in a short period of time. ECU 150 may variably set the detection time period (second cycle) of detection circuit 20 depending on the floating capacitance (registered specification) of the EVSE.

In S23, ECU 150 determines whether or not a state of charge (SOC) of battery 130 has reached an SOC upper limit value in accordance with the control mode (first charging control/second charging control). In first charging control, a first upper limit value shown in the standard specification is set as the SOC upper limit value. In second charging control, a second upper limit value shown in the registered specification is set as the SOC upper limit value. The second upper limit value (the SOC upper limit value in second charging control) is larger than the first upper limit value (the SOC upper limit value in first charging control). In this embodiment, external charging of battery 130 is continued until the SOC of battery 130 reaches the SOC upper limit value. ECU 150 carries out external charging of battery 130 with DC power supplied from the EVSE. Then, when the SOC of battery 130 reaches the SOC upper limit value (YES in S23), in 524, ECU 150 transmits a power feed stop command to the controller on the EVSE side and sets each of charge relay 120 and SMR 132 to the open state. Charging of battery 130 thus ends.

As set forth above, when the registered cable is connected to inlet 110, ECU 150 carries out second charging control, and in S23, ECU 150 sets the already known SOC upper limit value (large upper limit value) registered in storage 153. By doing so, battery 130 can be charged with more electric power while overcharging is avoided. In one example, the first upper limit value is set to 90% and the second upper limit value is set to 92%.

When the controller on the EVSE side receives the power feed stop command from ECU 150 (vehicle 50), in S32, it makes determination as YES, and in S33, it controls the power conversion circuit (for example, power conversion circuit 421A shown in FIG. 2 or power conversion circuit 421B shown in FIG. 3) to stop supply of electric power to vehicle 50. Power feed by the EVSE thus ends.

According to the charging method shown in FIGS. 8 and 9 described above, characteristics of the power feed facility to be used for charging of battery 130 mounted on vehicle 50 are estimated (511, S12, S131, S132, S141, and S142 in FIG. 8) and control in accordance with the power feed characteristics (S15 in FIG. 8 and FIG. 9) can be carried out during charging of battery 130.

In the embodiment, ECU 150 determines whether or not the charging cable connected to inlet 110 is the registered cable based on both of the identification code of the registered cable and the detection value from cable connection detection circuit 111. Without being limited as such, any method of detecting a registered cable is applicable. For example, ECU 150 may determine whether or not the charging cable connected to inlet 110 is the registered cable based on only any one of the identification code of the registered cable and the detection value from cable connection detection circuit 111.

Figure 10:
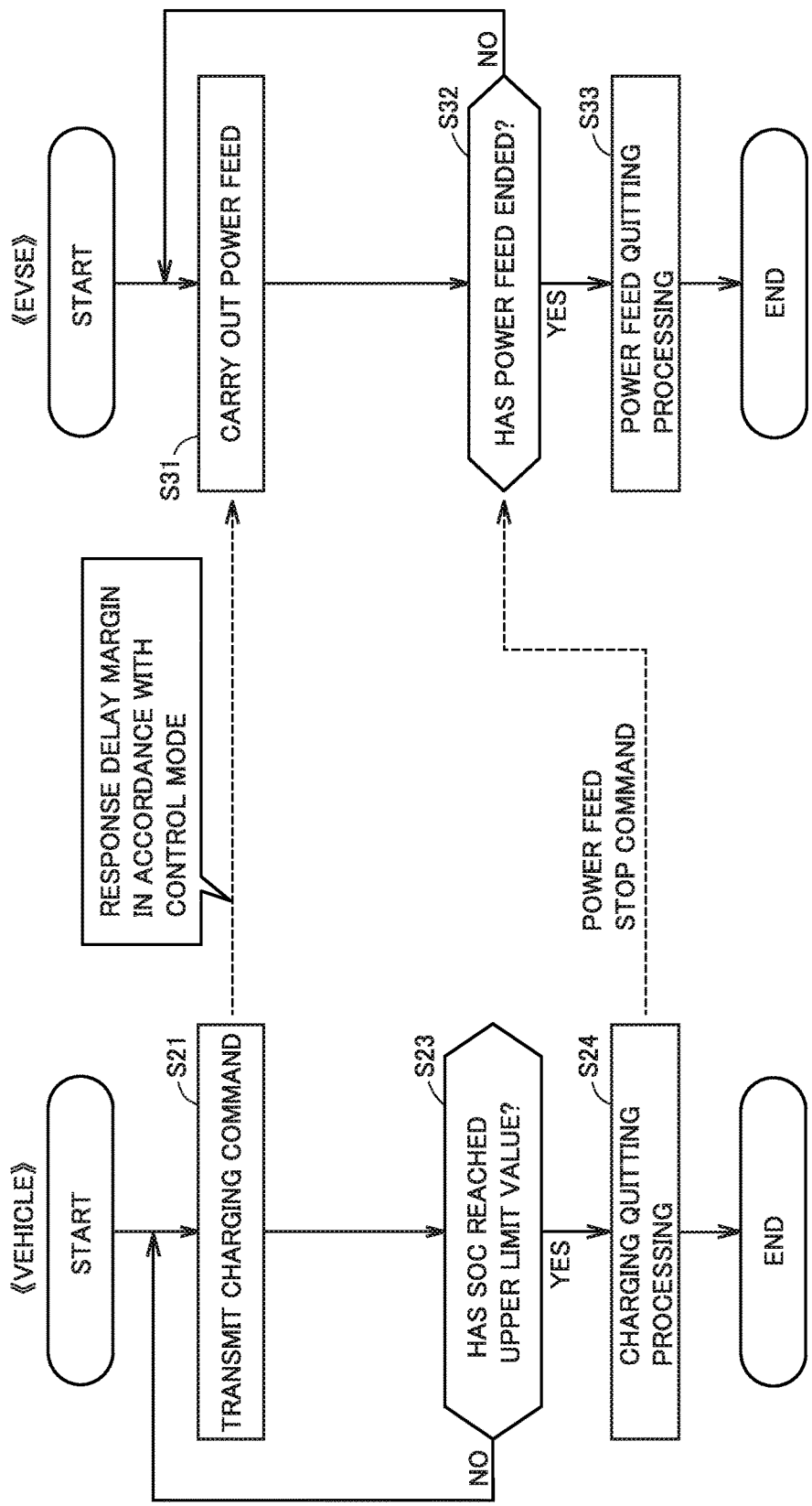
FIG. 10 is a flowchart showing a modification of the processing shown in FIG. 9.

Sensing of ground fault by the vehicle is not essential. For example, processing shown in FIG. 10 may be performed instead of the processing shown in FIG. 9. FIG. 10 is a flowchart showing a modification of the processing shown in FIG. 9. In the processing shown in FIG. 10, processing (S22 in FIG. 9) involved with ground fault detection is omitted. Change of the SOC upper limit value in accordance with the control mode in S23 is not essential either.

The power feed specification (the standard specification and the registered specification) stored in storage 153 can be modified as appropriate. The registered cable can also be changed as appropriate. For example, the charging cable (that is, the charging cable not including the AC/DC conversion circuit) employed in the power feed facility of the type shown in FIG. 2 may be set as the registered cable. Charging cables may be categorized into a registered cable and a non-registered cable from a point of view of whether or not the power feed specification thereof has already been known, rather than a point of view of whether or not the AC/DC conversion circuit is included. A charging cable employed in a power feed facility low in floating capacitance may be categorized as the registered cable, and a charging cable employed in a power feed facility high in floating capacitance may be categorized as the non-registered cable.

The configuration of the power feed facility is not limited to the configuration shown in FIGS. 2 and 3. For example, a circuit breaker that switches between supply and cut-off of electric power may be provided between the external power supply and the power conversion circuit.

The configuration of the ground fault detection circuit and the periphery thereof is not limited to the circuit configuration shown in FIG. 4. For example, though SMR 132 is arranged on a side of battery 130 relative to branch point D1 in the circuit configuration shown in FIG. 4, SMR 132 may be arranged on a side of travel driving unit 140 (for example, between branch point D1 and travel driving unit 140) relative to branch point D1.

The embodiment shows an example in which the charging controller (ECU 150) is mounted on vehicle 50. Without being limited as such, the charging controller may be mounted on a portable terminal (for example, a tablet terminal, a smartphone, a wearable device, or a service tool) carried by a user of vehicle 50.

The configuration of the vehicle is not limited to the configuration shown in FIG. 1. For example, the vehicle is not limited to a BEV and may be a PHEV. The vehicle is not limited to a passenger car, and a bus or a truck may be applicable. The vehicle may be an autonomous vehicle or may perform a flying function. The vehicle may be a vehicle that can travel without human intervention (for example, an automated guided vehicle or an agricultural implement).

Though an embodiment of the present disclosure has been described above, it should be understood that the embodiment disclosed herein is illustrative and non-restrictive in every respect. The scope of the present disclosure is defined by the terms of the claims, rather than the description above, and is intended to include any modifications within the scope and meaning equivalent to the terms of the claims.

What is claimed is:

1. A charging controller that carries out charging control of a power storage mounted on a vehicle, wherein
the vehicle includes
a DC charging inlet,
a first ground fault detection circuit, and
a second ground fault detection circuit shorter in detection time period than the first ground fault detection circuit,
the charging controller is configured
to carry out first charging control when a charging cable which is not a prescribed charging cable is connected to the DC charging inlet, and
to carry out second charging control when the prescribed charging cable is connected to the DC charging inlet,
each of the first charging control and the second charging control is control for charging the power storage with DC power supplied from outside of the vehicle to the DC charging inlet,
in the first charging control, ground fault detection is carried out by using the first ground fault detection circuit during charging of the power storage, and
in the second charging control, ground fault detection is carried out by using the second ground fault detection circuit during charging of the power storage.

2. The charging controller according to claim 1, wherein
the second ground fault detection circuit is a ground fault detection circuit for travel used in ground fault detection during travel of the vehicle, and
the prescribed charging cable is a charging cable employed in a power feed facility adapted to the ground fault detection circuit for travel.

3. The charging controller according to claim 1, wherein
the prescribed charging cable includes a charging cable including an AC/DC conversion circuit that converts AC power into DC power.

4. The charging controller according to claim 1, further comprising a storage that stores specifications indicating a power feed specification associated with the prescribed charging cable and a standard specification of a DC power feed facility, wherein
the first charging control is charging control adapted to the standard specification of the DC power feed facility, and
the second charging control is charging control adapted to the power feed specification associated with the prescribed charging cable.

5. The charging controller according to claim 1, wherein
in each of the first charging control and the second charging control, the charging controller transmits a power feed stop command when an amount of stored power in the power storage reaches an upper limit value, and
the upper limit value in the second charging control is larger than the upper limit value in the first charging control.

6. The charging controller according to claim 1, wherein
in each of the first charging control and the second charging control, while the vehicle is connected to a power feed facility outside the vehicle through a charging cable connected to the DC charging inlet, the charging controller transmits a charging command for controlling charging power to the power feed facility,
in the first charging control, the charging controller transmits the charging command with a first response delay margin to the power feed facility, and
in the second charging control, the charging controller transmits the charging command with a second response delay margin smaller than the first response delay margin to the power feed facility.

7. The charging controller according to claim 1, wherein
the charging controller is configured to determine whether a charging cable connected to the DC charging inlet is the prescribed charging cable based on at least one of an identification code of the charging cable and a detection value from a cable connection detection circuit.

8. The charging controller according to claim 1, wherein
in each of the first charging control and the second charging control, the charging controller measures an insulation resistance value of a positive electrode line of a circuit including the power storage, measures an insulation resistance value of a negative electrode line of the circuit including the power storage, and measures a voltage of the power storage, and carries out the ground fault detection by using a result of each measurement.

9. A vehicle comprising:
a DC charging inlet;
a power storage; and
a charging controller that carries out charging control of the power storage, wherein
the charging controller is configured
to carry out first charging control when a charging cable which is not a prescribed charging cable is connected to the DC charging inlet, and
to carry out second charging control when the prescribed charging cable is connected to the DC charging inlet, in each of the first charging control and the second charging control, while the vehicle is connected to a power feed facility outside the vehicle through a charging cable connected to the DC charging inlet, the charging controller transmits a charging command for controlling charging power to the power feed facility, in the first charging control, the charging controller transmits the charging command with a first response delay margin to the power feed facility, and in the second charging control, the charging controller transmits the charging command with a second response delay margin smaller than the first response delay margin to the power feed facility.

* * * * *